United States Patent [19]

Wyland

[11] Patent Number: 4,882,709

[45] Date of Patent: Nov. 21, 1989

[54] CONDITIONAL WRITE RAM

[75] Inventor: David C. Wyland, San Jose, Calif.

[73] Assignee: Integrated Device Technology, Inc., Santa Clara, Calif.

[21] Appl. No.: 236,552

[22] Filed: Aug. 25, 1988

[51] Int. Cl.[4] .............................................. G11C 7/00
[52] U.S. Cl. ........................... 365/189.02; 365/230.02; 365/233
[58] Field of Search ...................... 365/189.02, 230.02, 365/230.09, 238.5, 233

[56] References Cited

U.S. PATENT DOCUMENTS 4,402,067 8/1983 Moss et al. .................. 365/189.02 X Primary Examiner—Joseph A. Popek Attorney, Agent, or Firm—Thomas E. Schatzel

[57] ABSTRACT

To provide a means for the safe, premature, abortion of a write cycle without additional, read cycle, pipeline delays multiplexers and registers are included configured to store the address and data signals externally developed during a write cycle and to store in a RAM array the stored data at the stored address during the next write cycle. A comparator is included, configured to compare each stored address with each current address. Also included is a multiplexer configured to, during a read cycle, provide from the RAM array the currently addressed data when the current address is different than the stored address and to, during a read cycle, provide the register stored data when the current address matches the stored address.

8 Claims, 1 Drawing Sheet

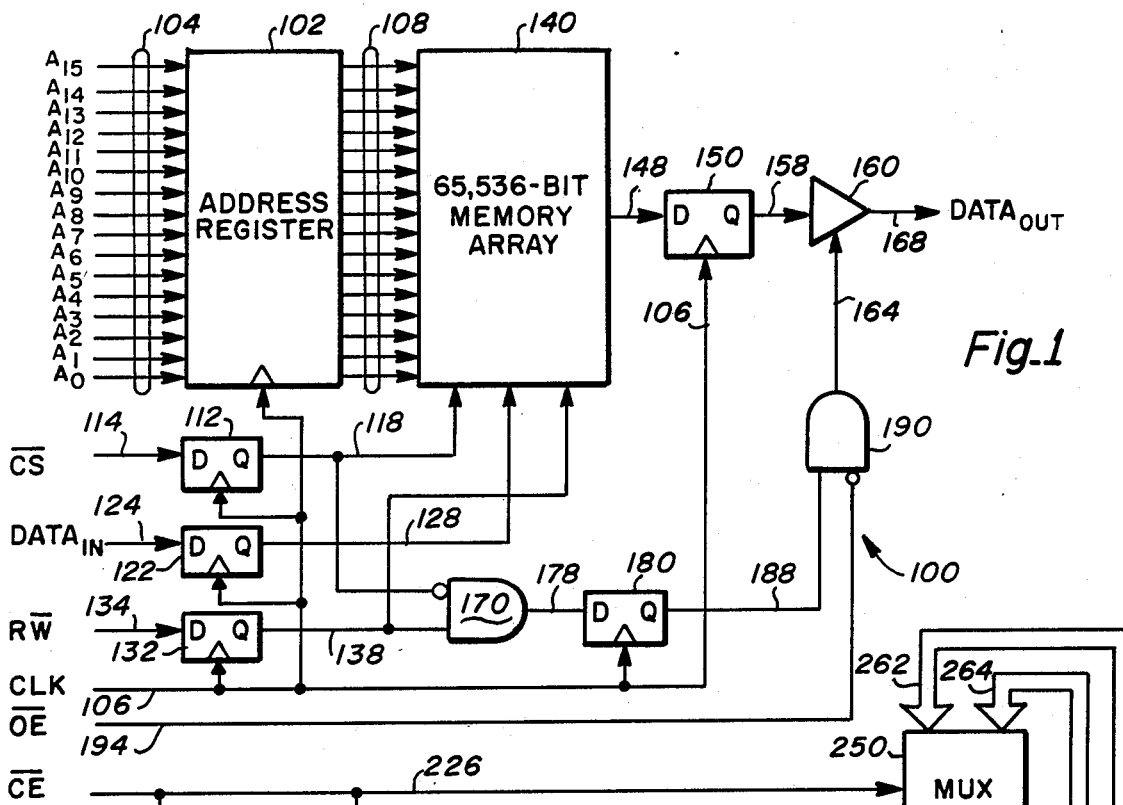
*Fig_1*
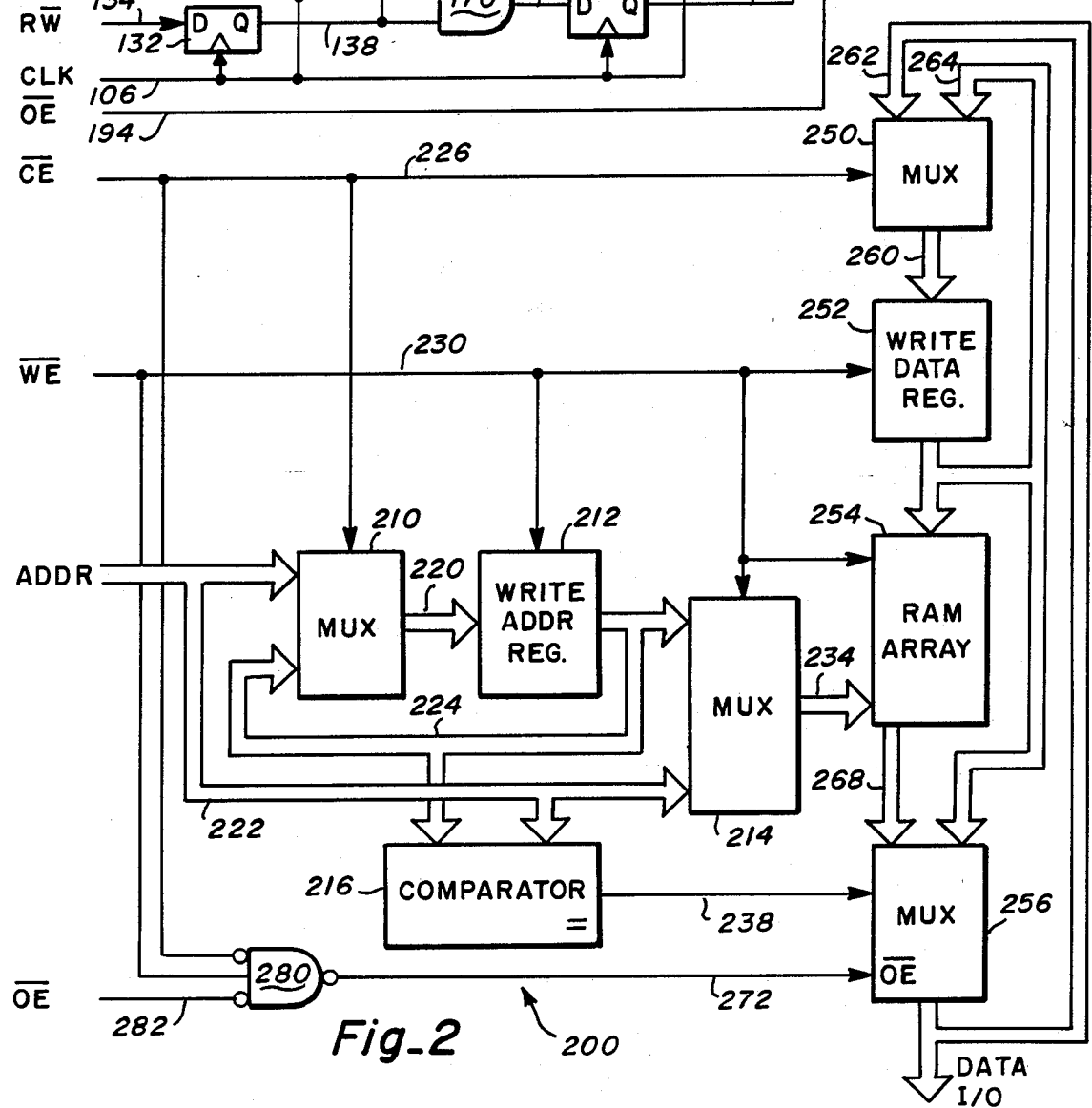
*Fig_2*

CONDITIONAL WRITE RAM

TECHNICAL FIELD

The present invention relates to integrated circuits generally and more specifically to a random access memory device having conditional write means for the safe, premature, abortion of a write cycle.

BACKGROUND ART

Random access memory (RAM) device include an array of storage circuits (cells), each having two stable states for storing a binary bit (digit) of data (information). Also, random access memory devices include decoding circuitry for indexing the various cells. In addition, random access memory devices include circuitry for writing data into indexed cell(s); and, circuitry for reading stored data out of indexed cell(s).

Unfortunately, because of various propagation and switching delays, it takes a period of time to write new information into and read stored information out of random access memory devices. Further, since writing is destructive, with most devices, once a write cycle is began, it can not be prematurely abandoned, with confidence that the data has not been corrupted.

To improve system performance, often times, a relatively large, but relatively slow, main memory is supplemented by a relatively small, but relatively fast, cache memory, to store frequently used data. In one embodiment (referred to as direct mapped cache memory), the cache memory is divided into two portions, respectively referred to as a data portion and a tag portion. Each of the portions is configured to be indexed by the least significant bits (only) of an address used to index the main memory. In addition, the data portion is configured to store at the indexed location the same word (bits) of data which is stored at the indexed location of the main memory; and, the tag portion is configured to store at the indexed location the other (the most significant) bits of the main memory address, which are referred to as the tag.

Included with the cache memory is a comparator, configured to compare each tag read from the tag portion of the cache memory with the tag portion of the (current) address. Also included with the cache memory is some control circuitry. The control circuitry is configured to, initially, clear (zero) the tag portion of the cache memory. In addition, the control circuitry is configured such that when a word of data is read, the tag stored at the indexed location of the tag portion of the cache memory is read and compared with the tag portion of the (current) address. If the two tags are different, referred to as a cache miss, the required word of data is not currently stored in the data portion of the cache memory. In that case, the circuitry reads the word of data from the (relatively slow) main memory. In addition, the circuitry stores the word of data (read from the main memory) at the indexed location of the data portion of the cache memory and stores the current tag at the indexed location of the tag portion of the cache memory. If the two tags are the same, referred to as a cache hit, the required word of data is currently stored in the data portion of the cache memory. In that case, the circuitry reads the word of data from the (data portion of the) (relatively fast) cache memory.

Usually, the control circuitry is, in addition, configured to do what is referred to as a write through. More specifically, when a word of data is written, the tag stored at the indexed location of the tag portion of the cache memory is read and compared with the tag portion of the (current) address. If the two tags are the same (and, usually, only if the two tags are the same), the circuitry stores the word of data at the indexed location of the data portion of the cache memory. Of course, in either case, the word of data is stored at the indexed location of the main memory. (Usually, the address and the data word are stored so that another operation can be performed while the word of data is being stored in the (relatively slow) main memory.)

It is important to note that, absent some means for, safely, prematurely abandoning a write cycle, a write to the cache memory requires two full cycles. Specifically, a read cycle (to read the tag stored at the indexed location of the tag portion of the cache memory and compare it with the tag portion of the (current) address) must be completed before a write cycle (to store the word of data at the indexed location of the data portion of the cache memory) may be begun.

A synchronous, random access memory device having conditional write means is disclosed in the Integrated Device Technology Incorporated preliminary applications note which is entitled CMOS Synchronous RAM 64K (64K by one-bit), which is designated IDT71501S, and which is dated December 1987. The device, which is illustrated in FIG. 1 of the drawing generally designated by the number 100, is shown to include a number of pipeline registers (flip-flops) configured to store the states of a number of externally-generated signals. More specifically, device 100 is shown to include an address register 102, that employs sixteen D-type flip-flops (which, for clarity, are not shown). The flip-flops of address register 102 are configured each with the data input connected to a respective line of a sixteen-line address bus 104, to receive a respective one of sixteen externally-generated indexing signals, with the flip-flop clock input connected to a line 106 to receive an externally-generated clocking signal, and with the flip-flop data output connected to a respective line of a sixteen-line bus 108. To store the state of an externally-generated (active-low) chip-selecting signal, another D-type flip-flop (register) 112 is included, which is configured with the flip-flop data input connected to a line 114 to receive the externally-generated chip-selecting signal, with the flip-flop clock input connected to line 106 to receive the externally-generated clocking signal, and with the flip-flop data output connected to a line 118. A D-type flip-flop 122 (register) is included to store the state of an externally-generated signal that represents a bit of data. Flip-flop 122 is configured with the flip-flop data input connected to a line 124 to receive the externally-generated data signal, with the flip-flop clock input connected to line 106 to receive the externally-generated clocking signal, and with the flip-flop data output connected to a line 128. Finally, to store the state of an externally-generated (active-low) write-enabling (read/write) signal, a D-type flip-flop (register) 132 is included, which is configured with the flip-flop data input connected to a line 134 to receive the externally-generated write-enabling signal, with the flip-flop clock input connected to line 106 to receive the externally-generated clocking signal, and with the flip-flop data output connected to a line 138.

Further, device 100 is shown to include a 64K by one array 140 of random access memory cells (and associated control logic). Array 140 is configured with the (sixteen) array address inputs each connected to a respective one of the sixteen lines of bus 108, with the (active-low) array chip-select input connected to line 118, with the array data input connected to line 128, with the (active-low) array write-enable (read/write) input connected to line 138 and with the array data output connected to a line 148.

Finally, device 100 is shown to include a pipeline register (flip-flop) configured, with another flip-flop, a pair of associated gates, and a buffer, to store the state of the data signal generated by array 140 and to develop an output signal. More specifically, to store the state of the array 140 data signal, device 100 is shown to include a D-type flip-flop (register) 150, which is configured with the flip-flop data input connected to line 148 to receive the data-output signal developed by array 140, with the flip-flop clock input connected to a line 106 to receive the externally-generated clocking signal, and with the flip-flop data output connected to a line 158. To buffer the flip-flop 150 stored data-output signal, a buffer 160 is included, which is configured with the buffer data input connected to line 158 to receive the stored data-output signal, with the buffer enable input connected to a line 164 to receive an output-enabling signal, and with the buffer data output connected to a line 168. A two-input AND gate 170, which has both a true (non-negated) input and a negated input is included. Gate 170 is configured with the negated gate input connected to line 118 to receive the stored chip-selecting signal, with the true gate input connected to line 138 to receive the stored write-enabling signal, and with the gate output connected to a line 178. A D-type flip-flop (register) 180 is included, which is configured with the flip-flop data input connected to line 178 to receive the gate 170 developed signal, with the flip-flop clock input connected to line 106 to receive the externally-generated clocking signal, and with the flip-flop data output connected to a line 188. Finally, included is another two-input AND gate 190, which also has both a true (non-negated) input and a negated input. Gate 190 is configured with the gate true input connected to line 188 to receive the flip-flop 180 developed signal, with the gate negated input connected to a line 194 to receive an externally-generated output-enabling signal, and with the gate output connected to line 164, upon which the gate develops the buffer 160 output-enabling signal. (Of course, an inverter can be employed to convert a true (non-negated) input into a negated input.)

With device 100, a write cycle can be prematurely abandoned with confidence that the data stored in the device has not been corrupted, by suitably altering the state of the write-enabling signal externally-generated on line 134 (or the chip-selecting signal externally-generated on line 114), before the time marked by the clocking signal externally-generated on line 106. Unfortunately, however, device 100 requires more than one cycle for a read operation. (During a first cycle, the externally-generated signals (including the address signals externally-generated on bus 104) are stored in the input registers (including register 102). During the next (second) cycle, the state of the data signal developed by random access memory array 140 on line 148 is stored in flip-flop (register) 150. Only late in the second cycle, at a time following the time marked by the clocking signal externally-generated on line 106 does the state of the signal developed by buffer 160 on line 168 represent the data stored in array 140 at the indexed location.) In addition, device 100 requires a special clocking signal (externally-generated on line 106).

DISCLOSURE OF THE INVENTION

It is therefor the primary object of the present invention is to provide a random access memory device having conditional write means for the safe, premature, abortion of a write cycle, which does not require multiple cycles for a read operation.

Another object of the present invention is to provide a random access memory device having conditional write means which is suitable for integration into a single device using CMOS technology.

Still another object of the present invention is to provide an integrated random access memory device having conditional write means which is relatively simple and inexpensive.

Briefly, the presently preferred embodiment of a conditional write means random access memory device in accordance with the present invention includes multiplexers and registers configured to store the address and data signals externally developed during a write cycle and to store in a RAM array the register stored data at the register stored address during the next write cycle. A comparator is included, configured to compare each register stored address with each current address. Also included is a multiplexer configured to, during a read cycle, provide from the RAM array the currently addressed data when the current address is different than the register stored address and to, during a read cycle, provide the register stored data when the current address matches the register stored address.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a block diagram of a random access memory device having conditional write means; and FIG. 2 is a block diagram of a random access memory device having conditional write means in accordance with the present invention.

BEST MODE FOR CARRYING OUT THE INVENTION

The presently preferred embodiment of a random access memory device having conditional write means in accordance with the present invention is illustrated in FIG. 2 of the drawing generally designated by the number 200. Device 200 is shown to include a multiplexer 210, a write address register 212, a multiplexer 214, and a comparator 216. Multiplexer 210 is configured to develop on each of fourteen lines of a bus 220 signals, each of which have the same state as a corresponding one of fourteen signals externally-generated on a fourteen-line external address bus 222 or internally-developed on a fourteen-line internal address bus 224, as selected responsive to the state of an (active-low) chip-enable signal externally-generated on a line 226. In another embodiment, multiplexer 210 employs four devices of the type which are commonly designated 74F157 quadruple two-line-to-one-line data selectors/multiplexers. The devices are configured with (fourteen of the sixteen) A-inputs each connected to a respective one of the fourteen lines of external address bus 222, with the (corresponding fourteen of the sixteen) B-inputs each connected to a respective one of the fourteen lines of internal address bus 224, with the (corresponding fourteen of the sixteen) (Y) outputs each connected to a respective one of the fourteen lines of bus 220, and with the (four) (active-low) (S) select inputs each connected to line 226. (The four (active-low) (G) strobe inputs are each connected to a low-logic-level potential.)

Write address register 212 is configured to store the state of each of the fourteen signals developed on the fourteen lines of bus 220 at each of a number of times marked by (the low-to-high transition of) a write-enable signal externally-generated on a line 230 and to develop on each of the fourteen lines of internal address bus 224 signals each having a corresponding one of the stored states. In another embodiment, register 212 employs two devices of the type which are commonly designated 74F374 octal D-type positive edge-triggered flip-flops. The devices are configured with (fourteen of the sixteen) data (D) inputs each connected to a respective one of the fourteen lines of bus 220, with the (corresponding fourteen of the sixteen) (Q) outputs each connected to a respective one of the fourteen lines of internal address bus 224, and with the (two) clock inputs each connected to line 230. (The two (active-low) output-control inputs are each connected to a low-logic-level potential.)

Multiplexer 214 is configured to develop on each of fourteen lines of a bus 234 signals, each of which have the same state as a corresponding one of the fourteen signals internally-developed on the fourteen-lines of internal address bus 224 or externally-generated on the fourteen-lines of external address bus 222, as selected responsive to the state of the (active-low) write-enable signal externally-generated on a line 230. In another embodiment, multiplexer 214 employs four devices of the type which are commonly designated 74F157 quadruple two-line-to-one-line data selectors/multiplexers. The devices are configured with (fourteen of the sixteen) A-inputs each connected to a respective one of the fourteen lines of internal address bus 224, with the (corresponding fourteen of the sixteen) B-inputs each connected to a respective one of the fourteen lines of external address bus 222, with the (corresponding fourteen of the sixteen) (Y) outputs each connected to a respective one of the fourteen lines of bus 234, and with the (four) (active-low) (S) select inputs each connected to line 230. (The four (active-low) (G) strobe inputs are each connected to a low-logic-level potential.)

Comparator 216 is configured to compare the state of the fourteen signals internally-developed on the fourteen-lines of internal address bus 224 each with the state of the corresponding one of the fourteen signals externally-generated on the fourteen-lines of external address bus 222 and to develop on a line 238 a signal the state of which indicates when the states of the bus 224 signals match those of the bus 222 signals. In another embodiment, comparator 216 employs two devices of the type which are commonly designated 74F521 eight-bit equality comparator. The devices are configured with (fourteen of the sixteen) P-inputs each connected to a respective one of the fourteen lines of internal address bus 224, with the (corresponding fourteen of the sixteen) 0-inputs each connected to a respective one of the fourteen lines of external address bus 222, and with the (P equals Q) output of a first one of the devices connected to line 238. The (P equals Q) output of the other (second) one of the devices is connected to the (cascading) G-input of the first one of the devices; and, the unused inputs (P, Q, and G) are each connected to a low-logic-level potential.

In addition, device 200 is shown to include a multiplexer 250, a write data register 252, a 16K by four array 254 of random access memory cells (and associated control logic), and a multiplexer 256. Multiplexer 250 is configured to develop on each of four lines of a bus 260 signals, each of which have the same state as a corresponding one of four signals externally-generated on a four-line external data bus 262 or internally-developed on a four-line internal data bus 264, as selected responsive to the state of the (active-low) chip-enable signal externally-generated on line 226. In another embodiment, multiplexer 250 employs a device of the type which is commonly designated 74F157 quadruple two-line-to-one-line data selectors/multiplexers. The device is configured with the A-inputs each connected to a corresponding one of the four lines of external data bus 262, with the four B-inputs each connected to a corresponding one of the four lines of internal data bus 264, with the four (Y) outputs each connected to a corresponding one of the four lines of bus 260, and with the (active-low) (S) select input connected to line 226. (The (active-low) (G) strobe input is connected to a low-logic-level potential.)

Write data register 252 is configured to store the state of each of the four signals developed on the four lines of bus 260 at each of the times marked by (the low-to-high transition of) the write-enable signal externally-generated on line 230 and to develop on each of the four lines of internal data bus 264 signals each having a corresponding one of the stored states. In another embodiment, register 252 employs a device of the type which is commonly designated 74F374 octal D-type positive edge-triggered flip-flops. The device is configured with (four of the eight) data (D) inputs each connected to a respective one of the four lines of bus 260, with the (corresponding four of the eight) (Q) outputs each connected to a respective one of the four lines of internal data bus 264, and with the clock input connected to line 230. (The (active-low) output-control input is connected to a low-logic-level potential.)

Random access memory array 254 is configured with the fourteen array address inputs each connected to a corresponding one of the fourteen lines of bus 234, with the four array data inputs each connected to a corresponding one of the four lines of internal data bus 264, with the four array data outputs each connected to a corresponding one of four lines of a bus 268, and with the array write-enable input connected to line 230. In another embodiment, array 254 employs a device of the type which is commonly designated 71981.

Multiplexer 256 is configured to develop on each of the four lines of external data bus 262 signals, each of which have the same state as a corresponding one of the four signals developed on the four lines of bus 26B or developed on the four lines of internal data bus 264, as selected responsive to the state of the signal developed by comparator 216 on line 238, when enabled responsive to the state of a signal developed on a line 272. In another embodiment, multiplexer 256 employs a device of the type which is commonly designated 74F257 quadruple two-line-to-one-line data selectors/multiplexers. The device is configured with the four A-inputs each connected to a respective one of the four lines of bus 268, with the corresponding four B-inputs each connected to a respective one of the four lines of internal data bus 264, with the corresponding four (Y) outputs each connected to a respective one of the four lines of external data bus 262, with the (active-low) (S) select input connected to line 238, and with the (active-low) (G) output-control (enable) input each connected to line 272.

Finally, device 200 is shown to include a three-input AND gate 280, which has two negated inputs and a true (non-negated) input. Gate 280 is configured with one of the negated gate inputs connected to line 226 to receive the externally-generated (active-low) chip-enable signal, with the true gate input connected to line 230 to receive the externally-generated (active-low) write-enable signal, with the other negated gate input connected to a line 282 to receive an (active-low) output-enable signal externally-generated on the line, and with the gate output connected to line 272. In another embodiment, gate 280 employs a 74F02-type two-input NOR gate and a 74F00-type two-input NAND gate. The 74F02-type two-input NOR gate is configured with one of the gate inputs connected to line 226 and with the other one of the gate inputs connected to line 282. The 74F00-type two-input NAND gate is configured with one of the gate inputs connected to line 230, with the other one of the (second) gate inputs connected to the output of the first gate, and with the (second) gate output connected to line 272.

In yet another embodiment, separate data input and data output buses are employed. More specifically, the (four) inputs of multiplexer 250 shown connected to bus 262 are connected to one (data input) bus; and, the (four) outputs of multiplexer 256, which are shown connected to bus 262, are connected to another (data output) bus. (The (four) (active-low) (G) output-control (enable) inputs of the 74F257-type devices of multiplexer 256 are each connected to a low-logic-level potential.)

In the presently preferred embodiment, all of the components of the above-described conditional write means random access memory device (200) are integrated into a single device using CMOS technology.

Operationally, during each write cycle, at the time marked by (the low-to-high transition of) the write-enable signal externally-generated on line 230, the state of each of the fourteen address signals externally-developed on the fourteen lines of bus 220 are stored in write address register 212; and, the state of each of the four data signals externally-developed on the four lines of bus 262 are stored in write data register 252. Also, during each write cycle, at the time marked by the (active-low) write-enable signal externally-generated on line 230, the state of each of the four data signals stored in write data register 252 during the previous *write cycle* are stored in random access memory array 254 at the location indexed by the state of the fourteen address signals previously stored in write address register 212. (Of course, during the very first write cycle (after the power is turned on), the states stored in write data register 252 and write address register 212 are unknown (garbage). However, at that time, the states stored in unknown access memory array 254 are also random (garbage). Thus, no information is lost.)

During each read cycle, multiplexer 214 develops on each of the fourteen lines of bus 234 signals, each of which have the same state as the corresponding one of the fourteen address signals externally-generated on the fourteen-lines of external address bus 222. Responsive thereto, random access memory array 254 develops on each of the four lines of bus 268 signals, each of which have the same state as those of the word of data stored at the indexed location of the array. Also, during each read cycle, comparator 216 compares the state of the fourteen address signals internally-developed on the fourteen-lines of internal address bus 224 by write address register 212 each with the state of the corresponding one of the fourteen address signals externally-generated on the fourteen-lines of external address bus 222. If the states of the bus 224 signals do not match those of the bus 222 signals, the requested (indexed) word of data is stored in random access memory array 254. In this case, multiplexer 256 develops on each of the four lines of bus 262 signals, each of which have the same state as the corresponding one of the four bus 268 signals, in other words, the indexed random access memory array 254 data word signals. On the other hand, if the states of the bus 224 signals match those of the bus 222 signals, the requested word of data is not yet stored in random access memory array 254, the word of data being still stored in write data register 252. In this later case, multiplexer 256 develops on each of the four lines of bus 262 signals, each of which have the same state as the corresponding one of the four bus 264 signals, in other words, the write data register 252 data word signals.

It is contemplated that after having read the preceding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. A conditional write means random access memory circuit comprising in combination:
   an external address bus for connection to receive a plurality of externally-generated signals representing an address;
   an internal address bus;
   a write address register including a plurality of data inputs, a clock input for connection to receive a predetermined one of at least two externally-generated control signals, and a plurality of data outputs connected to said internal address bus, said write address register for storing the state of each of said externally-generated address signals at each of a series of times marked by said write address register one of said externally-generated control signals and for developing on said internal address bus a plurality of signals each having a corresponding one of said stored externally-generated address signal states;
   an address multiplexer including a plurality of A-inputs connected to said internal address bus, a plurality of B-inputs, a select input for connection to receive a predetermined one of said externally-generated control signals, and a plurality of outputs, said address multiplexer for developing at said address multiplexer outputs a plurality of signals each having the same state as a corresponding one of said internal address bus signals when said address multiplexer one of said externally-generated control signals has a predetermined state and having the same state as a corresponding one of said externally-generated address signals when said address multiplexer one of said externally-generated control signals has another predetermined state;
a comparator including a plurality of P-inputs connected to said internal address bus, a plurality of Q-inputs, and an output, said comparator for developing at said comparator output a signal having a predetermined state when the states of said internal address bus signals match those of said externally-generated address signals and having another predetermined state otherwise;
address coupling means connected to said external address bus, to said write address register data inputs, to said address multiplexer B-inputs, and to said comparator Q-inputs, said address coupling means for coupling each of said externally-generated address signals to said write address register data inputs, to said address multiplexer B-inputs, and to said comparator Q-inputs;
at least one external data line for connection to receive at least one externally-generated signal representing at least one bit of data;
at least one internal data line;
a write data register including at least one data input, a clock input for connection to receive a predetermined one of said externally-generated control signals, and at least one data output connected to said internal data line, said write data register for storing the state of said externally-generated data signal at each of a series of times marked by said write data register one of said externally-generated control signals and for developing on said internal data line at least one signal having said stored externally-generated data signal state;
data coupling means connected to said external data line and to said write data register data input, said data coupling means for coupling said externally-generated data signal to said write data register data input;
a random access memory array including a plurality of address inputs each connected to said address multiplexer outputs, at least one data input connected to said internal data line, a write-enable input for connection to receive a predetermined one of said externally-generated control signals, and at least one data output; and
a data multiplexer including at least one A-input connected to said internal data line, at least one B-input connected to said random access memory array data output, a select input connected to said comparator output, and at least one output, said data multiplexer for developing at said data multiplexer output at least one signal having the same state as said internal data line signal when said comparator output signal has a predetermined state and having the same state as a signal developed at said random access memory array data output when said comparator output signal has another predetermined state.

2. A circuit as recited in claim 1 wherein said data multiplexer further includes an output-control input for connection to receive a signal derived from an externally-generated output-enabling signal, wherein said data multiplexer output is connected to said external data line, and wherein said data multiplexer only develops said data multiplexer output signal when said signal derived from said externally-generated output-enabling signal has a predetermined state.

3. A circuit as recited in claim 1 wherein said externally-generated control signals include a write-enabling signal and a chip-enabling signal, wherein said write address register clock input is for connection to receive said write-enabling signal, wherein said address multiplexer select input is for connection to receive said write-enabling signal, wherein said write data register clock input is for connection to receive said write-enabling signal, and wherein said random access memory array write-enable input is for connection to receive said write-enabling signal.

4. A circuit as recited in claim 3 further comprising gate means including an input for connection to receive said write-enabling signal, an input for connection to receive said chip-enabling signal, an input for connection to receive an externally-generated output-enabling signal and an output, wherein said data multiplexer further includes an output-control input connected to said gate means output, wherein said data multiplexer output is connected to said external data line, and wherein said data multiplexer only develops said data multiplexer output signal when a signal developed at said gate means output has a predetermined state.

5. A conditional write means random access memory circuit comprising in combination:
an external address bus for connection to receive a plurality of externally-generated signals representing an address;
an internal address bus;
a first address multiplexer including a plurality of A-inputs connected to said external address bus, a plurality of B-inputs connected to said internal address bus, a select input for connection to receive a predetermined one of at least two externally-generated control signals, and a plurality of outputs, said first address multiplexer for developing at said first address multiplexer outputs a plurality of signals each having the same state as a corresponding one of said external address bus signals when said first address multiplexer one of said externally-generated control signals has a predetermined state and having the same state as a corresponding one of a plurality of internal address bus signals when said first address multiplexer one of said externally-generated control signals has another predetermined state;
a write address register including a plurality of data inputs connected to said first address multiplexer outputs, a clock input for connection to receive a predetermined one of said externally-generated control signals, and a plurality of data outputs connected to said internal address bus, said write address register for storing the state of each of said first address multiplexer output signals at each of a series of times marked by said write address register one of said externally-generated control signals and for developing on said internal address bus said internal address bus signals each having a corresponding one of said stored first address multiplexer output signal states;
an second address multiplexer including a plurality of A-inputs connected to said internal address bus, a plurality of B-inputs connected to said external address bus, a select input for connection to receive a predetermined one of said externally-generated control signals, and a plurality of outputs, said second address multiplexer for developing at said second address multiplexer outputs a plurality of signals each having the same state as a corresponding one of said internal address bus signals when said second address multiplexer one of said externally-generated control signals has a predetermined state and having the same state as a corresponding one of said external address bus signals when said second address multiplexer one of said externally-generated control signals has another predetermined state;

a comparator including a plurality of P-inputs connected to said internal address bus, a plurality of Q-inputs connected to said external address bus, and an output, said comparator for developing at said comparator output a signal having a predetermined state when the states of said internal address bus signals match those of said external address bus signals and having another predetermined state otherwise;

at least one external data line for connection to receive at least one externally-generated signal representing at least one bit of data;

at least one internal data line;

a first data multiplexer including at least one A-input connected to said external data line, at least one B-input connected to said internal data line, a select input for connection to receive a predetermined one said externally-generated control signals, and at least one output, said first data multiplexer for developing at said first data multiplexer output at least one signal having the same state as said external data line signal when said first data multiplexer one of said externally-generated control signals has a predetermined state and having the same state as at least one internal data line signal when said first data multiplexer one of said externally-generated control signals has another predetermined state;

a write data register including at least one data input connected to said first data multiplexer output, a clock input for connection to receive a predetermined one of said externally-generated control signals, and at least one data output connected to said internal data line, said write data register for storing the state of said first data multiplexer output signal at each of a series of times marked by said write data register one of said externally-generated control signals and for developing on said internal data line said internal data line signal having said stored first data multiplexer output signal state;

a random access memory array including a plurality of address inputs each connected to said second address multiplexer outputs, at least one data input connected to said internal data line, a write-enable input for connection to receive a predetermined one of said externally-generated control signals, and at least one data output; and a second data multiplexer including at least one A-input connected to said internal data line, at least one B-input connected to said random access memory array data output, a select input connected to said comparator output, and at least one output, said second data multiplexer for developing at said second data multiplexer output at least one signal having the same state as said internal data line signal when said comparator output signal has a predetermined state and having the same state as a signal developed at said random access memory array data output when said comparator output signal has another predetermined state.

6. A circuit as recited in claim 5 wherein said second data multiplexer further includes an output-control input for connection to receive a signal derived from an externally-generated output-enabling signal, wherein said second data multiplexer output is connected to said external data line, and wherein said second data multiplexer only develops said second data multiplexer output signal when said signal derived from said externally-generated output-enabling signal has a predetermined state.

7. A circuit as recited in claim 5 wherein said externally-generated control signals include a chip-enabling signal and a write-enabling signal, wherein said first address multiplexer select input is for connection to receive said chip-enabling signal, wherein said write address register clock input is for connection to receive said write-enabling signal, wherein said second address multiplexer select input is for connection to receive said write-enabling signal, wherein said first data multiplexer select input is for connection to receive said chip-enabling signal, and wherein said random access memory array write-enable input is for connection to receive said write-enabling signal.

8. A circuit as recited in claim 7 further comprising gate means including an input for connection to receive said write-enabling signal, an input for connection to receive said chip-enabling signal, an input for connection to receive an externally-generated output-enabling signal and an output, wherein said second data multiplexer further includes an output-control input connected to said gate means output, wherein said second data multiplexer output is connected to said external data line, and wherein said second data multiplexer only develops said second data multiplexer output signal when a signal developed at said gate means output has a predetermined state.

* * * * *